United States Patent [19]

Walker et al.

[11] Patent Number: 5,391,908
[45] Date of Patent: Feb. 21, 1995

[54] LATERAL INSULATED GATE FIELD EFFECT SEMICONDUCTOR

[75] Inventors: Philip Walker; David H. Paxman, both of Redhill, England

[73] Assignee: U.S. Philips Corporation, New York, N.Y.

[21] Appl. No.: 141,467

[22] Filed: Oct. 22, 1993

Related U.S. Application Data

[63] Continuation of Ser. No. 854,188, Mar. 20, 1992, abandoned.

[30] Foreign Application Priority Data

Mar. 22, 1991 [GB] United Kingdom ............... 9106108

[51] Int. Cl.$^6$ ................... H01L 29/76; H01L 29/94; H01L 31/062; H01L 31/113
[52] U.S. Cl. ........................ 257/409; 257/339; 257/343; 257/408
[58] Field of Search ............. 257/336, 339, 343, 409, 257/408

[56] References Cited

U.S. PATENT DOCUMENTS

| | | | |
|---|---|---|---|
| 4,344,080 | 8/1982 | Tihanyi | 257/336 |
| 4,609,929 | 9/1986 | Jayaraman et al. | 257/339 |
| 4,721,986 | 1/1988 | Kinzer | 257/343 |
| 4,920,393 | 4/1990 | Kawakami | 257/409 |
| 4,990,982 | 2/1991 | Omoto et al. | 257/409 |
| 5,055,896 | 10/1991 | Williams et al. | 257/409 |
| 5,089,871 | 2/1992 | Fujihara | 257/408 |

*Primary Examiner*—Steven Ho Yin Loke
*Attorney, Agent, or Firm*—Steven R. Biren

[57] ABSTRACT

A semiconductor body (1) has a first region (2) of one conductivity type adjacent one major surface (3). Second and third regions (5 and 6) of the opposite conductivity type are provided within the first region (2) adjacent the one major surface (3) and an insulated gate structure (80) overlies a conduction channel region (9) between the second and third regions (5 and 6) for providing a gateable connection along the length (L) of the conduction channel region (9) between the second and third regions (5 and 6). The insulated gate structure (80) has a gate insulating region (81) and a gate conductive region (82) extending on the gate insulating region (81) and up onto a relatively thick insulating region (4) adjoining the gate insulating region (81). The gate insulating region (81) overlaps with the periphery (6a) of the portion (62) of the third region (6) adjacent the insulated gate structure (80) so that, in a direction (D) transverse to the length (L) of the conduction channel region (9), the gate conductive region (82) extends from the gate insulating region (81) up onto the relatively thick insulating region (4) over the first region (2). The corner (10b) at which the gate insulating region (81) adjoins the relatively thick insulating region (4) thus lies over the first region (2) and not over the third region (6), thereby reducing the electric field stress at the corner (10b).

8 Claims, 2 Drawing Sheets

LATERAL INSULATED GATE FIELD EFFECT SEMICONDUCTOR

This is a continuation of application Ser. No. 07/854,188, filed Mar. 20, 1992, now abandoned.

BACKGROUND OF THE INVENTION

This invention relates to a lateral insulated gate field effect semiconductor device.

U.S. Pat. No. 4,344,080 describes a lateral insulated gate field effect semiconductor device, comprising a semiconductor body having a first region of one conductivity type adjacent one major surface, second and third regions of the opposite conductivity type provided within the first region adjacent the one major surface and an insulated gate structure overlying a conduction channel region between the second and third regions for providing a gateable connection along the length of the conduction channel region between the second and third regions, the insulated gate structure having a gate insulating region and a gate conductive region extending on the gate insulating region and up onto a relatively thick insulating region adjoining the gate insulating region.

It should be understood that, as used herein, the phrase 'lateral insulated gate field effect semiconductor device' means an insulated gate field effect semiconductor device in which the main current flow is along or substantially parallel to the one major surface of the semiconductor body.

The device described in U.S. Pat. No. 4,344,080 is a field effect transistor in which the second and third regions form the source and drain regions, respectively, of the device. In this example, the portion of the third region is a relatively lowly doped drain drift region which is designed so that the number of dopant atoms increases from the gate electrode toward the relatively highly doped portion of the drain region with the aim of increasing the reverse breakdown voltage between the drain and the gate or control electrode without having to resort to stepped insulating layer structures and auxiliary electrodes.

In the device described in U.S. Pat. No.4,344,080 the relatively thick insulating region and an underlying channel stopper region define a window within which the source, drain and drain drift regions and the insulated gate structure are provided. The drain drift region will thus extend at least up to and generally, by virtue of the lateral diffusion of the impurities to form the drain drift region, will overlap with the edge of the window in the relative thick insulating region. Accordingly, in the devices described in U.S. Pat. No. 4,344,080, the drain drift region will thus extend beneath the step in the insulating material where the gate insulating region which covers the window adjoins the relatively thick insulating region.

The present inventors have found that in known lateral insulated gate field effect devices a particularly high electric field stress can exist at the sharp edge or corner where the gate conductive region steps up onto the relatively thick insulating region and that this particularly high electric field stress makes the devices susceptible to breakdown in this region particularly after continuous use or testing at high temperatures.

SUMMARY OF THE INVENTION

It is an aim of the present invention to provide a lateral insulated gate field effect semiconductor device capable of withstanding high (for example 60 volts) reverse voltages between the device regions, for example the source and drain regions in the case of a field effect transistor.

According to the present invention, there is provided a lateral insulated gate field effect semiconductor device, comprising a semiconductor body having a first region of one conductivity type adjacent one major surface, second and third regions of the opposite conductivity type provided within the first region adjacent the one major surface and an insulated gate structure overlying a conduction channel region between the second and third regions for providing a gateable connection along the length of the conduction channel region between the second and third regions, the insulated gate structure having a gate insulating region and a gate conductive region extending on the gate insulating region and up onto a relatively thick insulating region adjoining the gate insulating region, characterized in that the gate insulating region overlaps with the periphery of the portion of the third region adjacent the insulated gate structure so that, in a direction transverse to the length of the conduction channel region, the gate conductive region extends from the gate insulating region up onto the relatively thick insulating region over the first region.

In a device in accordance with the invention, adjacent the insulated gate structure, the gate insulating region and the overlying gate conductive region extend beyond the periphery of the portion of the third region so that the location at which the gate conductive region steps up onto the relatively thick insulating region is positioned over a region of the semiconductor device which, in at least one mode of operation of the device, is at the same voltage or a voltage very similar to that of the insulated gate structure. The extension of the gate insulating region and overlying gate conductive region acts to spread the electrical field laterally beyond the periphery of the portion of the third region so reducing the electric field stress at the pn junction between the third and first regions. Furthermore the sharp edge or corner at which the gate insulating region adjoins the relatively thick insulating region lies over the first region and not over the third region. This acts to reduce the electric field stress at the sharp edge or corner especially in the at least one mode of operation because the vertical electric field between the insulated gate structure and the first region will in the at least one mode be small if not negligible.

Where the device is for example a lateral insulated gate field effect transistor in which the second and third regions form the source and drain regions, respectively, of the transistor then in at least one mode of operation of the device the drain region may be at a relatively high voltage, for example 60 volts, compared to the first region which may be at 0 volts. Where the transistor is an enhancement or normally-off device, then, when no voltage is applied to the insulated gate structure so that the device is non-conducting, there will be a relatively high reverse-biassing voltage between the first region and the drain region and there will be a similarly high voltage between the drain region and the insulated gate structure. However, because in a device in accordance with the invention the sharp corner or edge at which the gate insulating region adjoins the relatively thick insulating region does not lie over the portion of the drain region but rather over the first region, the voltage difference between the gate conductive region where it steps up onto the relatively thick insulating region and the underlying semiconductor region is very small, if not negligible. Accordingly, the electric field stress experienced by this sharp corner or edge in a device in accordance with the invention is much reduced in comparison to that experienced in known devices and thus the susceptibility of the insulating material to causing device breakdown due to electric field stress at such a sharp corner or edge is less of a problem because the electric field stress experienced by the sharp corner or edge is reduced.

In a preferred example, the insulated gate structure is provided within a window in the relatively thick insulating region and the portion of the third region is of smaller dimensions than the window in the direction transverse to the length of the conduction channel region so that in said transverse direction the further region does not extend beyond the periphery of the window. The window may be substantially rectangular having first and second parallel edges lying along the direction of the length of the conduction channel region and the portion of the third region may be formed so as not to extend beyond the first and second edges in the said transverse direction. The device may thus be a linear device in which the source, insulated gate and drain are arranged in a row and a compatible shape, that is substantially rectangular, may be used for the window while avoiding the excessive electric stresses which would otherwise arise if the third region extended beneath the sharp corners of the substantially rectangular window.

The portion of the third region may be a relatively lowly doped portion which extends from the remaining relatively highly doped portion of the third region towards the second region. The relatively highly doped portion may be provided within the relatively lowly doped portion. The relatively lowly doped portion acts to spread the electric field laterally and so improve the breakdown voltage of the device. As mentioned above, the second and third regions may form the source and drain regions of an insulated gate field effect transistor and where the said portion is relatively lowly doped, it will form a drain drift region.

BRIEF DESCRIPTION OF THE DRAWING

Embodiments of the invention will now be described, by way of example, with reference to the accompanying drawing, in which.

Figure 1:
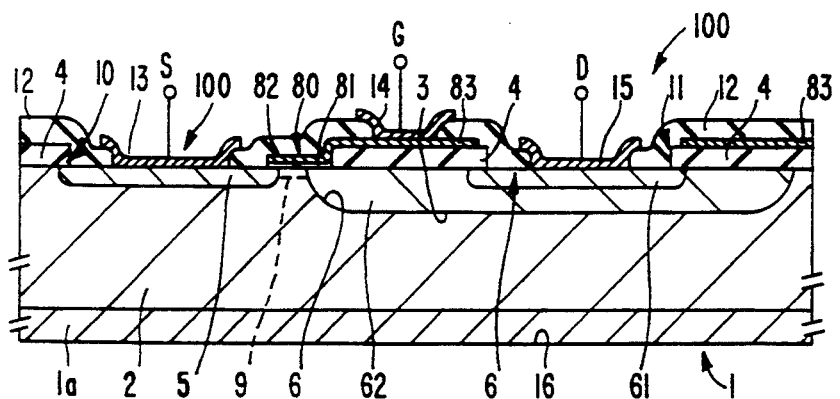
FIG. 1 is a schematic cross-sectional view of a lateral insulated gate field effect semiconductor device in accordance with the invention.
Figure 2:
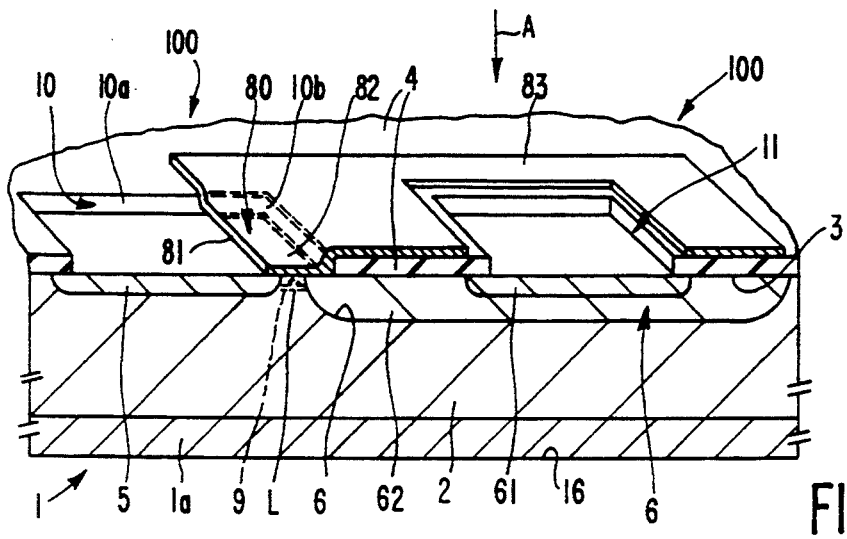
FIG. 2 is a schematic sectioned perspective view of the lateral insulated gate field effect semiconductor device shown in FIG. 1 with the overlying insulating layer and metallization omitted.
Figure 3:
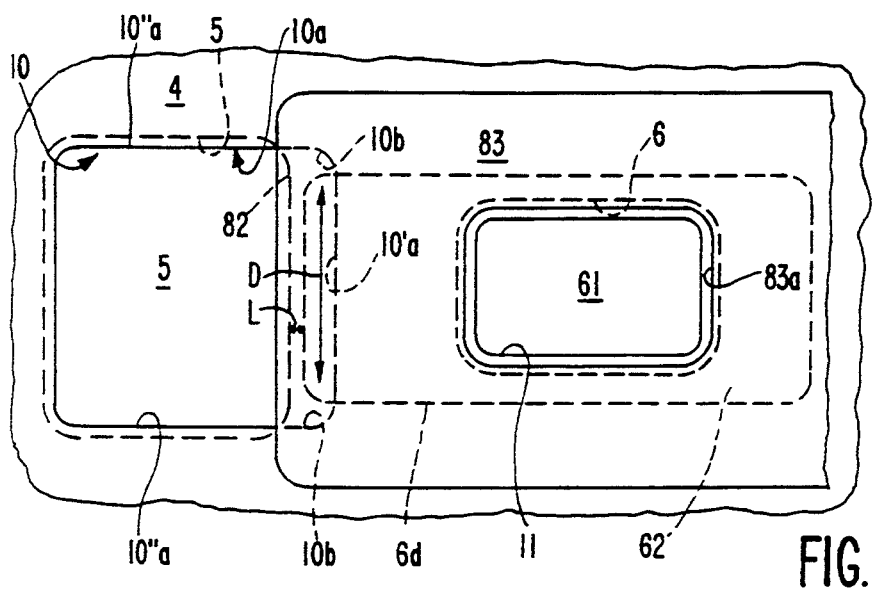
FIG. 3 is a schematic plan view, looking in the direction of arrow A in FIG. 2, of the structure shown in FIG. 2.

It should be understood that FIGS. 1 to 3 are merely schematic and are not drawn to scale. In particular certain dimensions such as the thickness of layers or regions may have been exaggerated while other dimensions may have been reduced. It should also be understood that the same reference numerals are used throughout the Figures to indicate the same or similar parts.

DESCRIPTION OF THE PREFERRED EMBODIMENT

Referring now to the drawings, in particular FIGS. 1 to 3, there is illustrated a lateral insulated gate field effect semiconductor device 100, comprising a semiconductor body 1 having a first region 2 of one conductivity type adjacent one major surface 3, second and third regions 5 and 6 of the opposite conductivity type provided within the first region 2 adjacent the one major surface 3 and an insulated gate structure 80 overlying a conduction channel region 9 between the second and third regions 5 and 6 for providing a gateable connection along the length L of the conduction channel region 9 between the second and third regions 5 and 6, the insulated gate structure 80 having a gate insulating region 81 and a gate conductive region 82 extending on the gate insulating region 81 and up onto a relatively thick insulating region 4 adjoining the gate insulating region 81. In accordance with the invention, the gate insulating region 81 overlaps with the periphery 6a of the portion 62 of the third region 6 adjacent the insulated gate structure 80 so that, in a direction D (see FIG. 3) transverse to the length L of the conduction channel region 9, the gate conductive region 82 extends from the gate insulating region 81 up onto the relatively thick insulating region 4 over the first region 2.

The gate insulating region 81 and the overlying gate conductive region 82 thus extend beyond the periphery 6a of the portion 62 of the third region 6 so that the location at which the gate conductive region 82 steps up onto the relatively thick insulating region 4 is positioned over a region 2 of the semiconductor device which, in at least one mode of operation of the device, is at the same voltage or a voltage very similar to that of the insulated gate structure 80. The extension of the gate insulating region 81 and overlying gate conductive region 82 acts to spread the electrical field laterally beyond the periphery 6a of the portion 62 of the third region 6, so reducing the electric field stress at the pn junction 6a between the third 6 and first 2 region. Furthermore the sharp edge or corner 10b at which the gate insulating region 81 adjoins the relatively thick insulating region 4 lies over the first region 2 and not over the third region 6. This acts to reduce the electric field stress at the sharp edge or corner 10b especially in the at least one mode of operation because the vertical electric field between the insulated gate structure 80 and the first region 2 will, in the at least one mode, be small if not negligible.

FIGS. 1 to 3 show a lateral insulated gate field effect (IGFET) transistor 100 in accordance with the invention. It should be appreciated that FIG. 2 is a part-perspective part-sectional view of the IGFET shown in FIG. 1 with a further insulating layer 12 and electrodes 13,14 and 15 omitted in the interests of clarity. FIG. 3 is a plan view, that is a view looking down on the surface 3, of the structure shown in FIG. 2.

In the example illustrated in FIGS. 1 to 3, the semiconductor body 1 comprises a relatively highly doped monocrystalline silicon substrate 1a, in this example an n conductivity type substrate, on which is provided a lowly doped n-conductivity type monocrystalline silicon epitaxial layer which forms the first region 2 and has a resistivity of, typically, from 0.5 to 100 Ohm-cm, depending upon the desired breakdown voltage.

The second region 5 and a relatively highly doped portion 61 of the third region 6 forming the source and drain regions, respectively, of the IGFET are provided as p conductivity type regions spaced apart adjacent the one major surface 3 of the semiconductor body 1. The portion 62 of the third region 6 adjacent the insulated gate structure 80 is more lowly doped than the portion 61 of the third region 6 and forms a drain drift region extending from the drain region 61 towards the source region 5. In this example, the drain drift region 62 encompasses the drain region 61 and is sufficiently lowly doped and sufficiently thin that it becomes fully depleted of free charge carriers before a reverse-biassing voltage across the pn junction 6a between the drain drift region 62 and the first region 2 reaches the breakdown voltage of that pn junction 6a. The drain drift region 62 thus acts to spread the depletion region of the reverse-biassed pn junction laterally along the one major surface 3 and so to reduce the electric field at the surface 3, thereby increasing the breakdown voltage of the device. Such a region is known as a RESURF (REduced SURface Field) region and is described in detail in, for example, a paper entitled 'high voltage thin layer devices (RESURF devices)' by J. A. Appels et al published in Philips Journal of Research Vol. 35, No. 1, 1980 at pages 1 to 13. As indicated in the aforementioned paper in order to function as a RESURF region, the product Nd of the thickness (or depth) d in cm and the doping concentration N in atoms cm$^{-3}$ of the region should be of the order of $2 \times 10^{12}$ atoms cm$^{-2}$.

The insulated gate structure 80 overlying the conduction channel region 9 of the first region 2 between the source region 5 and the drain drift region 62 is provided by a thin thermally grown gate oxide region 81 and an overlying conductive layer 82 which may be a metal layer but, in this example, is provided as a doped polycrystalline silicon layer.

The device is bounded by the relatively thick insulating region 4 which forms a field oxide region. The source region 5 is provided, together with the insulating gate structure 80, in a first window 10 in the relatively thick insulating region 4 so that the gate insulating region 81 adjoins a portion 10'a of the periphery 10a of the first window 10 in the relatively thick insulating region 4 and the gate conductive region 82 extends over the gate insulating region 81 and up onto the relatively thick insulating region 4 to provide, as will be described in greater detail below, a field plate 83 extending towards and around the drain region 61. The drain region 61 is provided in a second window 11 formed in the relatively thick insulating region 4 spaced-apart from the first window 10. As shown most clearly in FIGS. 2 and 3, the first and second windows 10 and 11 are generally rectangular but have rounded corners. As shown in FIG. 1, a further insulating layer 12 covers the insulated gate structure 80 and is formed with contact openings for enabling subsequent metallization to form the electrodes 13,14 and 15 contacting the source region 5, insulated gate structure 80 and drain region 6, respectively.

As can be seen most clearly from FIGS. 2 and 3, the drain drift region 62 extends part way beneath the insulated gate structure 80 in a direction along the length L of the conduction channel region 9 (that is the direction in which charge carriers flow along the conduction channel region 9) and so extends part way into the first window 10 crossing the portion 10'a of the periphery 10a of the first window 10. However, in a direction transverse to the channel length L, that is in a channel width direction indicated by the arrowed line D in FIG. 3, the drain drift region 62 is narrower than the first window 10 and so terminates within the first window 10. Accordingly, the drain drift region 62 does not extend beyond the two parallel edges 10''a of the generally rectangular window 10 and so does not extend beneath the corners 10b of the first window 10.

The gate insulating region 81 extends laterally (that is in the direction D) beyond the periphery 6a of the drain drift region 62 to meet the periphery 10a of the window 10 in the relatively thick insulating region 4. The gate conductive region 82 extends over the gate insulating region 81 and steps up onto the relatively thick insulating region 4 at the edge 10a of the window to provide the field plate 83. Accordingly, the gate conductive region 82 steps up onto the relatively thick insulating region 4 and in particular extends over the edges 10''a and the corner 10b of the first window 10 over the first region 2 and not over the drain drift region 62 or any other part of the third region 6. A window 83a larger than the window 11 is formed within the field plate 83 so that the field plate 83 stops just before the drain window 11.

By designing the device structure so that the portion 62, in the example shown the drain drift region, of the third region 6 adjacent the insulated gate structure 80 lies laterally within the window 10 in the relatively thick insulating region 4 and so that the gate insulating region 81 and overlying gate conductive region 82 extend laterally beyond (that is in the direction D) the periphery 10a of the window 10, the capability of the device to withstand high reverse voltages between the source and drain regions and in particular the reliability of the devices, that is their ability to withstand such high voltages in continuous use or testing,is improved.

Figure 4A:
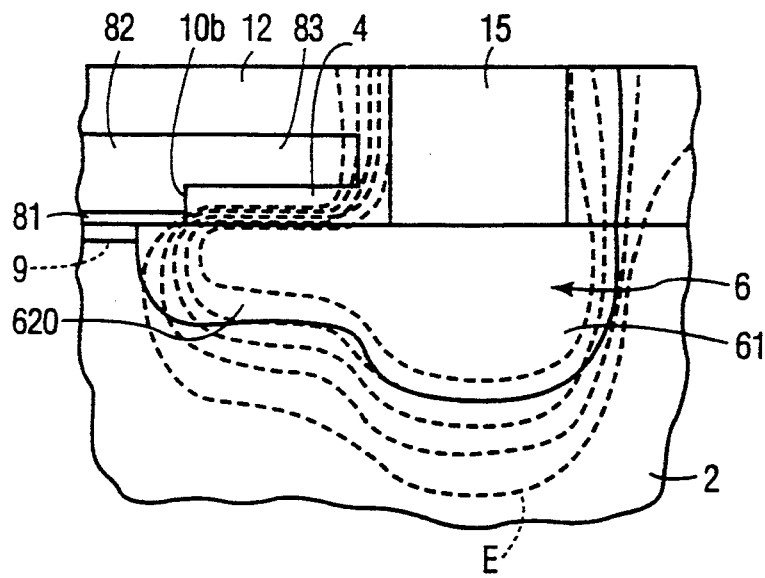
FIG. 4a illustrates graphically the results of a computer simulation of the electric field profile through a typical device in accordance with the invention.

The present inventors have found that in conventional lateral insulated gate field effect transistors the re-entrant corners, in particular, of the window in the relatively thick insulating region is subject to particularly high electric field stress. To illustrate this problem, FIG. 4a illustrates pictorially the results of a three-dimensional computer modelling simulation of a simplified version of a conventional lateral insulated gate field effect transistor. In particular, FIG. 4a illustrates a cross-sectional view through the drain end of the insulated gate field effect transistor. In the interests of clarity the various regions are not shown cross-hatched in FIG. 4a. For comparison purposes, similar reference numerals are used in FIG. 4a as in FIGS. 1 to 3 with the exception that the drain drift region of the conventional transistor shown in FIG. 4a is referenced by the numeral 620. Although not shown in FIG. 4a, the drain drift region 620 of the conventional transistor illustrated by FIG. 4a extends laterally (that is in the direction transverse to the length of the conduction channel region 9 and equivalent to the direction D in FIG. 3) beyond the periphery of the first window in the relatively thick insulating region 4 and, in particular, extends beneath the re-entrant corner of the first window. The dashed lines E in FIG. 4a illustrate equipotential lines in the device structure. As can clearly be seen from FIG. 4a, there is a significant crowding or bunching of the equipotential lines at the step where the gate insulating region 81 adjoins the relatively thick insulating layer 4. This indicates that this particular area of the device structure is subject to high electric field stress and presents a weak point at which the device may breakdown.

In contrast to such conventional devices, in a device in accordance with the invention, the portion 62 of the third region 6, in the example being described the drain drift region, does not extend beneath the re-entrant corner 10b of the window 10 and the step in the insulating material at which the gate conductive region 82 extends up over the edge 10"a and the corner 10b of the window 10 lies over the first region 2 and not over the third region 6. The present inventors have found that with such a structure, there is no longer such a high electric field stress at the re-entrant corner 10b and that the device is capable of reliably withstanding high reverse voltages between the source and drain regions 5 and 6.

In at least one mode of operation of the transistor shown in FIGS. 1 to 3 the drain region 6 is at a relatively high voltage, for example 60 volts, compared to the source region 5 and the first region 2 which may be at 0 volts. In this example, where the transistor is an enhancement or normally-off device, then, when no voltage is applied to the insulated gate structure 80 so that the transistor is non-conducting, there will be a relatively high reverse-biassing voltage between the first region 2 and the drain region 6 and there will be a similarly high voltage between the drain region 6 and the insulated gate structure 80. However, because in a device in accordance with the invention the sharp corner or edge 10b at which the gate insulating region 81 adjoins the relatively thick insulating region 4 does not lie over the portion 62 of the drain region 6, in this example the drain drift region, but rather over the first region 2, the voltage difference between the gate conductive region 82 where it steps up onto the relatively thick insulating region 4 and the underlying semiconductor region is very small, if not negligible. Accordingly, the electric field stress experienced by this sharp corner or edge 10b in a device in accordance with the invention is much reduced in comparison to that experienced in known devices and thus the susceptibility of the insulating material to causing device breakdown due to electric field stress at such a sharp corner or edge 10b is less of a problem.

Figures 4B, 4C:
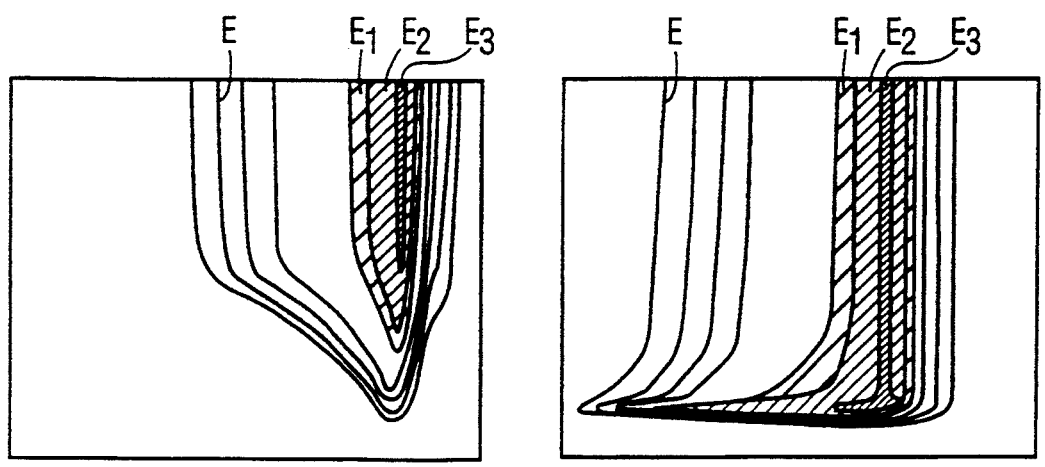
FIG. 4b illustrates graphically the results of a computer simulation of the electric field profile at a corner of the window in the insulating region where the further region terminates within the window in accordance with the invention.
FIG. 4c illustrates graphically, for comparison purposes, the results of a computer simulation of the electric field profile at a corner of the window in the insulating region of a device not in accordance with the present invention in which the further region extends beneath the corner.

FIGS. 4b and 4c are schematic representations of color contour plots illustrating the results of three-dimensional computer modelling simulations to show the electric field profile in the vicinity of the re-entrant corner 10b of the window 10 in the field oxide 4. The solid lines E show the equipotential lines and the regions of highest electric field stress $E_1$, $E_2$ and $E_3$ are shown hatched with the concentration of hatching increasing with the electric field so that the regions $E_3$ or the region of highest electric field. In the two examples shown, the drain region was at a voltage $V_D$ of 60 volts while the first region 2, source region 5 and insulated gate structure 80 were at 0 (zero) volts. FIG. 4b shows the structure for a device in accordance with the invention as shown in FIGS. 1 to 3 where the drain drift region 62 terminates below the field plate 83 away from the re-entrant corner 10b while FIG. 4c shows the situation for a device in which the drain drift region extends beneath the re-entrant corner 10b of the relatively thick insulating layer 4 but which is otherwise similar to that shown in FIGS. 1 to 3. In the case of FIG. 4b the maximum electric field $E_{max}$ was $1.03 \times 10^6$ V/cm (volts per cm) while in the case of FIG. 4c the maximum electric field $E_{max}$ was $1.44 \times 10^6$ V/cm. The maximum electric field observed in the vicinity of the re-entrant corner 10b for a device in accordance with the invention having the structure shown in FIGS. 1 to 3 was thus approximately 70% of that of the device illustrated by FIG. 4c. Accordingly, a device in accordance with the invention should be able to withstand high reverse source-drain operating voltages and should be more reliable than previous designs.

The device shown in FIGS. 1 to 3 may be manufactured by first forming the drain drift region 62 by introducing p conductivity type impurities, for example by implanting boron ions, through an appropriate mask. After introducing the impurities for forming the drain drift region 62, the relatively thick insulating region 4 is provided. The relatively thick insulating region 4 may be provided by depositing insulating material, for example silicon oxide, using conventional CVD (chemical vapor deposition) techniques and opening the windows 10 and 11 using conventional photolithographic and etching techniques. However, the relatively thick insulating region 4 could be provided by using local oxidation of silicon (LOCOS) techniques in which the areas of the windows 10 and 11 are masked by an anti-oxidation (e.g. silicon nitride) layer and the semiconductor body subjected to a thermal oxidation process to grow the relatively thick insulating region 4.

After definition of the relatively thick insulating region 4, a thin thermal oxide layer is grown in the windows 10 and 11 for forming the gate insulating region 81 and then polycrystalline silicon is deposited for forming the gate conductive region 82. The polycrystalline silicon layer may be doped during or after deposition so as to render it conductive or may be doped during the introduction of the impurities to form the source and drain regions 5 and 6.

The polycrystalline silicon layer is then patterned using conventional photolithographic and etching techniques to define the gate conductive region 82 and the extension of the gate conductive region to form the field plate 83. Impurities for forming the source region 5 and the relatively highly doped portion 61 of the drain region 6 are then introduced, for example by implanting phosphorus ions, using the relatively thick insulating region 4 and the gate conductive region 82 as a mask so that the source region 5 and relatively highly doped portion 61 of the third region are aligned to the windows 10 and 11, respectively, and the source region 5 is also aligned to the insulated gate structure 80.

The further insulating layer 12 is then provided by conventional deposition techniques and contact windows opened to enable connection to the source region 5, the relatively highly doped portion 61 of the drain region 6 and the insulated gate structure 80. Metallization is then deposited and patterned to form the electrodes 13,14,15 (FIG. 1) contacting, respectively, the source region 5, the insulated gate structure 80 and the relatively highly doped portion 61 of the drain region 6.

In the embodiment shown in FIGS. 1 to 3, the first and second windows 10 and 11 are of a generally rectangular with rounded corners shape when viewed in plan (see FIG. 3). However, the present invention may also be applied where the windows 10 and 11 have different shapes. Although the device shown in FIGS. 1 to 3 is a linear device, the device may have rotational symmetry about the center of the drain region. This would however increase the area occupied by the device.

In addition, the present invention may be applied to lateral insulated gate field effect devices other than IGFETs. Thus, for example, the third region 6 could be replaced by a region of the opposite conductivity type (n conductivity type in this example) to form the anode region of a lateral insulated gate bipolar transistor (LIGT). Such an anode region may be shorted to a p conductivity type drain region.

FIGS. 1 and 2 illustrate the semiconductor body 1 as having a relatively highly doped substrate 1a. This could however be omitted. Where the relatively highly doped substrate 1a is provided, an ohmic contact (not shown) may be provided on the adjacent major surface 16 of the semiconductor body 1 to provide a substrate bias connection. The device illustrated in FIGS. 1 to 3 may be integrated in the same semiconductor body 1 with other semiconductor devices. In particular, the device illustrated in FIGS. 1 to 3 may form a high voltage lateral insulated gate field effect device of an intelligent power switch which incorporates in the same semiconductor body a power device such as a power MOSFET and high and low voltage logic circuitry for controlling this power device. In such an example, the substrate 1a may form a contact region of the power device, for example the substrate 1a may form the drain contact region of the power MOSFET where the power device is a vertical power MOSFET.

It will of course be appreciated that the conductivity types given above can be reversed and that the semiconductor body could be formed from a material other than silicon, for example a III-V semiconductor material such as gallium arsenide.

From reading the present disclosure, other modifications and variations will be apparent to persons skilled in the art. Such modifications and variations may involve other features which are already known in the semiconductor art and which may be used instead of or in addition to features already described herein.

We claim:

1. A lateral insulated gate field effect semiconductor device, comprising a semiconductor body having a first region of a first conductivity type adjacent one major surface, second and third regions of a second conductivity type opposite to said first conductivity type provided within the first region adjacent the one major surface and an insulated gate structure overlying a conduction channel region between the second and third regions for providing a gateable connection along a length of the conduction channel region between the second and third regions, the insulated gate structure having a gate insulating region and a gate conductive region extending on the gate insulating region and up onto a relatively thick insulating region adjoining the gate insulating region, characterized in that the gate insulating region overlaps with a periphery of a first portion of the third region adjacent the insulated gate structure and, in a channel width direction of the conduction channel region, a portion of the gate conductive region at a corner of a window in said relatively thick insulating region extends from the gate insulating region up onto the relatively thick insulating region only over the first region, and in that the insulated gate structure is provided within said window in the relatively thick insulating region and a width of said first portion of the third region is of smaller width than a width of the window in the channel width direction of the conduction channel region so that in said channel width direction the third region does not extend beyond the periphery of the window.

2. A device according to claim 1, further characterized in that the window is substantially rectangular, having first and second parallel edges lying along a direction of the length of the conduction channel region, and the first portion of the third region does not extend beyond the first and second edges in said channel width direction.

3. A device according to claim 1, further characterized in that the first portion of the third region is a first relatively lowly doped portion which extends from a second relatively lowly doped portion of the third region towards the second region.

4. A device according to claim 3, further characterized in that a relatively highly doped portion of the third region lies within the relatively lowly doped portion of the third region.

5. A device according to claim 3, further characterized in that a relatively highly doped portion of the third region is provided under a further window in the relatively thick insulating region.

6. A device according to claim 3, further characterized in that the gate conductive region extends over the first relatively lowly doped portion of the third region.

7. A device according to claim 1, further characterized in that the second and third regions form the source and drain regions, respectively, of an insulated gate field effect transistor.

8. A lateral insulated gate field effect semiconductor device as in claim 1, wherein the gate conductive region extends laterally beyond the entirety of the periphery of the third region.

* * * * *